(12) United States Patent
Fabregas et al.

(10) Patent No.: US 11,598,812 B2
(45) Date of Patent: Mar. 7, 2023

(54) METHODS AND SYSTEMS FOR PERFORMING DIAGNOSTIC PROCESSES WITH REDUCED PROCESSING TIME

(71) Applicant: Lear Corporation, Southfield, MI (US)

(72) Inventors: Antoni Ferre Fabregas, Valls (ES); Jose Gabriel Fernandez Banares, Valls (ES)

(73) Assignee: Lear Corporation, Southfield, MI (US)

( * ) Notice: Subject to any disclaimer, the term of this patent is extended or adjusted under 35 U.S.C. 154(b) by 1148 days.

(21) Appl. No.: 16/191,680

(22) Filed: Nov. 15, 2018

(65) Prior Publication Data
US 2020/0158784 A1    May 21, 2020

(51) Int. Cl.
*G01R 31/00*    (2006.01)
*G01R 27/02*    (2006.01)
(Continued)

(52) U.S. Cl.
CPC ......... *G01R 31/3648* (2013.01); *G01R 27/02* (2013.01); *G01R 31/005* (2013.01); *G07C 5/0816* (2013.01)

(58) Field of Classification Search
CPC .... G01R 31/3648; G01R 31/36; G01R 27/02; G01R 31/005; G07C 5/0816
See application file for complete search history.

(56) References Cited

U.S. PATENT DOCUMENTS 9,772,392 B2    9/2017 Deumal Herraiz et al.
9,977,065 B2    5/2018 Miret et al.
(Continued)

FOREIGN PATENT DOCUMENTS

CN    101535827 A    9/2009
CN    102574534 A    7/2012
(Continued)

OTHER PUBLICATIONS

Chinese Patent and Trademark Office, First Chinese Office Action for corresponding Chinese Patent Application No. 201910724457.X dated Jun. 2, 2021.

*Primary Examiner* — Natalie Huls
*Assistant Examiner* — Sharad Timilsina
(74) *Attorney, Agent, or Firm* — Brooks Kushman P.C.

(57) ABSTRACT

Operation for performing diagnostics, such as vehicle diagnostics including short circuit and low impedance diagnostics during a high-voltage (HV) battery pre-charging a power-net of the vehicle and including insulation resistance monitoring diagnostics for measuring an insulation resistance between the power-net and another power-net, with reduced processing time includes measuring a physical parameter (voltage or current signal) as the parameter is being generated by a device-under-test to which the diagnostic process pertains. The diagnostic process requires a stable value of the parameter. The parameter variates while being generated during a beginning time and is stable while being generated during an ending time. While the parameter is being generated during the beginning time, a stable value of the parameter which the parameter will have during the ending time is predicted. The stable value of the parameter is predicted based on variation of measured values of the parameter during the beginning time.

7 Claims, 4 Drawing Sheets

(51) Int. Cl.
    *G01R 31/36*     (2020.01)
    *G07C 5/08*     (2006.01)

(56) References Cited

U.S. PATENT DOCUMENTS

| | | | |
|---|---|---|---|
| 10,040,366 B2 | 8/2018 | Lee | |
| 2010/0036627 A1 | 2/2010 | Bergveld et al. | |
| 2012/0197505 A1 | 8/2012 | Friesen et al. | |
| 2012/0253713 A1* | 10/2012 | Krajci | G01R 31/388 |
| | | | 702/63 |
| 2013/0106437 A1 | 5/2013 | Herraiz et al. | |
| 2015/0369875 A1 | 12/2015 | Ishii | |
| 2017/0259685 A1 | 9/2017 | Lee | |
| 2017/0322248 A1* | 11/2017 | Miret | G01R 31/52 |

FOREIGN PATENT DOCUMENTS

| | | |
|---|---|---|
| CN | 103389436 A | 11/2013 |
| CN | 104956233 A | 9/2015 |
| CN | 105929294 A | 9/2016 |
| CN | 107179510 A | 9/2017 |
| CN | 107340428 A | 11/2017 |

* cited by examiner

METHODS AND SYSTEMS FOR PERFORMING DIAGNOSTIC PROCESSES WITH REDUCED PROCESSING TIME

TECHNICAL FIELD

The present invention relates to processes for performing diagnostics such as vehicle diagnostics.

BACKGROUND

A diagnostics process for a vehicle involves comparing a physical parameter generated during a vehicle operation with a standard. A control action may be taken depending on the comparison. Ordinarily, the comparison requires comparing a stabilized value of the physical parameter with the standard. However, it may take time for the physical parameter to stabilize. Consequently, the diagnostics process and any resulting control action are delayed.

SUMMARY

A method for performing a diagnostics process with reduced processing time is provided. The method includes measuring, by a sensor in communication with a controller, a physical parameter as the physical parameter is being generated by a device-under-test to which the diagnostic process pertains. The diagnostic process requires a stable value of the physical parameter. The physical parameter variates while being generated during a beginning period of time and is stable while being generated during an ending period of time. The method further includes predicting, by the controller, while the physical parameter is being generated during the beginning period of time, a stable value of the physical parameter that the physical parameter will have during the ending period of time. The stable value of the physical parameter being predicted based on variation of measured values of the physical parameter during the beginning period of time. The method further includes comparing, by the controller, the predicted stable value of the physical parameter with a standard and performing, by the controller, a control action depending on the comparison of the predicted stable value of the physical parameter with the standard.

The method may further include obtaining, by the controller, from the measuring of the physical parameter by the sensor, values of the physical parameter at a first pair of time instants of a first time segment during the beginning period of time and values of the physical parameter at a second pair of time instants of a succeeding second time segment during the beginning period of time. In this case, the stable value of the physical parameter is predicted based on (i) a first slope for the first time segment dependent on the values of the physical parameter at the first pair of time instants and (ii) a second slope for the second time segment dependent on the values of the physical parameter at the second pair of time instants.

The method may further include obtaining, by the controller, from the measuring of the physical parameter by the sensor, values of the physical parameter at three or more time instants of a first time segment during the beginning period of time and values of the physical parameter at three or more time instants of a succeeding second time segment during the beginning period of time. The stable value of the physical parameter is predicted based on (i) a first slope for the first time segment dependent on the values of the physical parameter at the three or more time instants and (ii) a second slope for the second time segment dependent on the values of the physical parameter at the three or more time instants.

The physical parameter may be an electrical parameter, such as a voltage signal or a current signal, or a thermal parameter, such as a temperature signal. The sensor is a corresponding sensor such as a voltage sensor, a current sensor, or a temperature sensor.

A system for a vehicle having a battery and a power-net is provided. The system includes a sensor and a controller in communication with the sensor. The controller is configured to control a pre-charge operation involving the battery charging the power-net and to perform a short circuit diagnostic process with reduced processing time for the pre-charge operation. The sensor is configured to measure an electrical parameter generated during the pre-charge operation. The short circuit diagnostic process requires a stable value of the electrical parameter. The electrical parameter variates while being generated during a beginning of the pre-charge operation and is stable while being generated during an ending of the pre-charge operation. The controller has a memory storing a predetermined, short circuit threshold. The controller is further configured to perform the short circuit diagnostic process by (i) predicting, while the electrical parameter is being generated during the beginning of the pre-charge operation, a stable value of the electrical parameter which the electrical parameter will have at a given time during the ending of the pre-charge operation, the controller predicting the stable value of the electrical parameter based on variation of measured values of the electrical parameter during the beginning of the pre-charge operation, and by (ii) comparing the predicted stable value of the electrical parameter with a value of the short circuit threshold at the given time to determine whether a short circuit exists.

The controller is further configured to perform a control action depending on whether a short circuit is detected. For example, the controller may be further configured to terminate the pre-charge operation, cause the power-net to be disconnected from the battery, and/or cause the vehicle to be immobilized upon a short circuit being detected.

The memory of the controller may further store a predetermined, low impedance threshold. In this case, the controller may be further configured to perform a low impedance diagnostics process with reduced processing time for the power-net during the pre-charge operation by comparing, while the electrical parameter is being generated during the beginning of the pre-charge operation, the stable value of the electrical parameter which the electrical parameter will have at the given time during the ending of the pre-charge operation with a value of the low impedance threshold at the given time to determine whether a low impedance exists.

The controller is further configured to perform a control action depending on whether a low impedance is detected. For example, the controller may be further configured to cause other diagnostic tests to be performed to try to identify any consuming loads which are not properly disconnected upon a low impedance being detected.

A system for a vehicle having a battery, a high-voltage (HV) power-net, and a low-voltage (LV) power-net is provided. The system includes a controller configured to perform an insulation resistance monitoring diagnostics process, for measuring an insulation resistance between the HV power-net and the LV power-net, with reduced processing time. The sensor is configured to measure an electrical parameter generated between the HV power-net and the LV power-net during the insulation resistance monitoring diagnostics process. The insulation resistance monitoring diagnostic process requires a stable value of the electrical parameter. The electrical parameter variates while being generated during a beginning of a cycle and is stable while being generated during an ending of the cycle. The controller is in communication with the sensor and is further configured to perform the insulation resistance monitoring diagnostics process by (i) predicting, while the electrical parameter is being generated during the beginning of the cycle, a stable value of the electrical parameter which the electrical parameter will have at a given time during the end of the cycle, the controller predicting the stable value of the electrical parameter based on variation of measured values of the electrical parameter during the beginning of the cycle, and by (ii) detecting a value of the insulation resistance based on a stable value of the electrical parameter.

The controller is further configured to perform a control action depending on the value of the insulation resistance. For example, the controller may be further configured to cause the vehicle to be immobilized and/or cause a HV battery of the vehicle to be disconnected from the HV power-net upon the value of the insulation resistance being low.

DETAILED DESCRIPTION

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
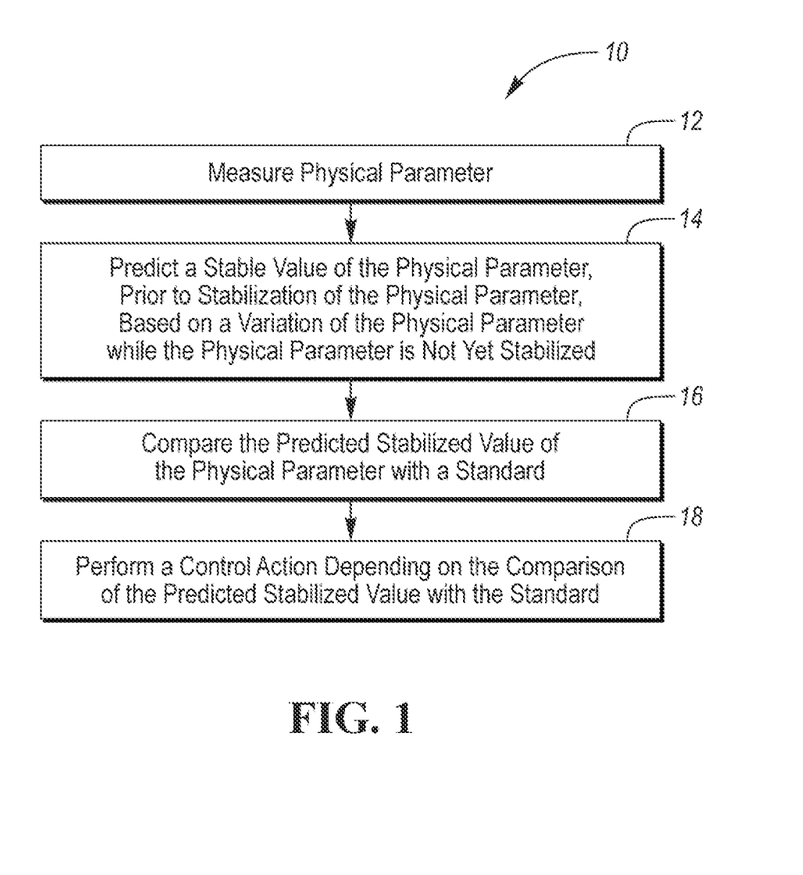
FIG. 1 illustrates a flowchart describing operation of methods and systems for performing diagnostic processes with reduced processing time.

Referring now to FIG. 1, a flowchart 10 describing operation of methods and systems for performing diagnostic processes with reduced processing time is shown. The operation includes measuring a physical parameter that is to be compared with a standard as part of a diagnostics process, as indicated in block 12. The physical parameter is generated during the diagnostics process such as by a "device-under-test" (e.g., a device, apparatus, system, etc., to which the diagnostic process pertains). The physical parameter may be an electrical parameter such as a voltage or current signal, a thermal parameter such as a temperature signal, etc.

The diagnostics process requires a stabilized value of the physical parameter. However, the physical parameter variates and is not stabilized during an initial generation stage of the physical parameter. The physical parameter becomes stabilized during a final generation stage of the physical parameter. As such, it takes time for the physical parameter to become stabilized.

The operation further includes predicting a stabilized value of the physical parameter prior to the physical parameter stabilizing, as indicated in block 14. The stabilized value of the physical parameter is predicted during the initial generation stage of the physical parameter at which the physical parameter is not yet stabilized. The predicted stabilized value is a prediction of a stabilized value of the physical parameter during the final generation stage of the physical parameter at which the physical parameter is stabilized. That is, the predicted stabilized value is a prediction of a value of the physical parameter once the physical parameter becomes stabilized.

As described, the physical parameter variates during the initial generation stage at which the physical parameter is not yet stabilized. The prediction of the stabilized value of the physical parameter involves analyzing the variation of the physical parameter while the physical parameter is not stabilized, as further indicated in block 14. The predicted stabilized value is calculated based on the variation of the physical parameter.

The operation further includes comparing the predicted stabilized value with a standard, as indicated in block 16; and performing a control action depending on the comparison of the predicted stabilized value with the standard, as indicated in block 18.

As indicated, diagnostic processes require a stabilized value of the physical parameter to be compared with a standard, but the physical parameter does not become stabilized for some time. The operation therefore has the benefit of reducing processing time of the diagnostic processes in that a predicted stabilized value of the physical parameter for comparison with the standard is provided prior to the physical parameter stabilizing. Thus, the operation does not entail waiting for the physical parameter to become stabilized. Consequently, instead of waiting for the physical parameter to become stabilized, the comparison step of block 16 and any resulting control action of block 18 may be performed before the physical parameter becomes stabilized. In this way, the diagnostic processes are performed with reduced processing time.

Figure 2A:
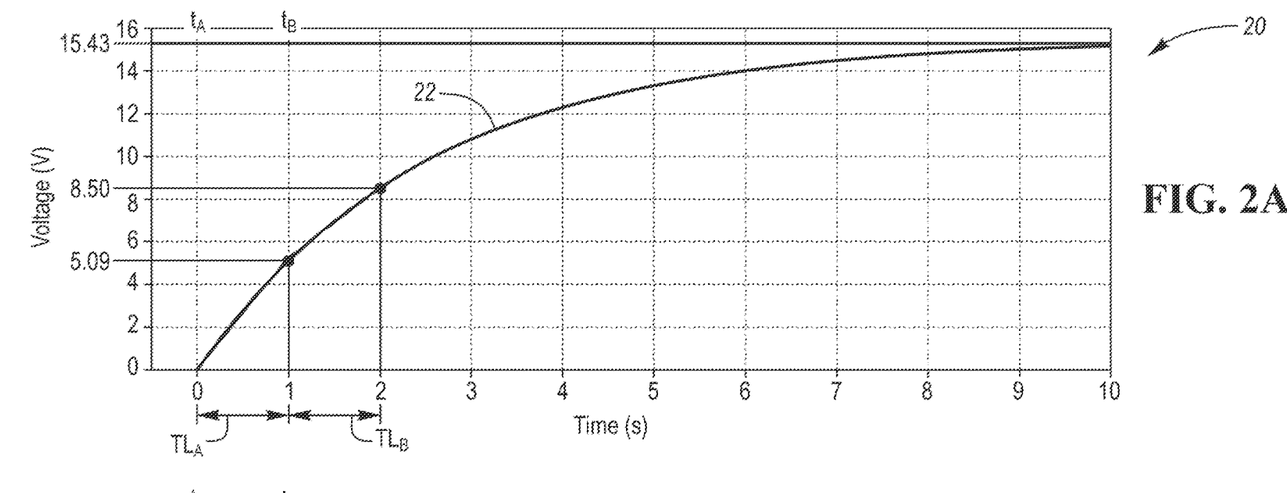
FIG. 2A illustrates a plot corresponding to a first calculation process for predicting a stabilized value of a voltage signal to be compared with a standard during a diagnostics process, the first calculation process being employed by methods and systems for performing the diagnostics process with reduced processing time.

Referring now to FIG. 2A, with continual reference to FIG. 1, a plot 20 corresponding to a first calculation process for predicting a stabilized value of a voltage signal 22 to be compared with a standard during a diagnostics process is shown. The first calculation process may be carried out by an electronic controller (e.g., a vehicle controller) or the like in communication with a voltage sensor to receive values of voltage signal 22 from the voltage sensor. Voltage signal 22 is a physical parameter which is measured over time pursuant to block 12 of FIG. 1. The first calculation process pertains to predicting a stabilized value of voltage signal 22 prior to the voltage signal stabilizing with the prediction being based on the variation of the voltage signal while the voltage signal is not stabilized. The first calculation process thus corresponds to block 14 of FIG. 1 and may be employed by methods and systems for performing the diagnostics process with reduced processing time.

Plot 20 is a plot of voltage signal 22 generated over time. For example, as shown in plot 20, the duration of the time is ten seconds with the starting time being zero seconds and the ending time being ten seconds. The general form of voltage signal 22 is known prior to measuring the voltage signal. This general form includes voltage signal 22 generally having an exponential shape and being continuous (but perhaps for noise), initially variating and becoming stable as time increases, and approaching a limit value or value range as the time approaches the ending time. However, what is not known prior to measuring voltage signal 22 is the actual value of the voltage signal at an ending time. That is, it is known prior to measuring voltage signal 22 that the value of the voltage signal at an ending time will be stabilized, but it is not known what that value is until the voltage signal is measured at the ending time. As indicated in FIG. 2A, the value of voltage signal 22 measured at the ending time of ten seconds is 15.43 V. Thus, after measuring voltage signal 22 for ten seconds, a stabilized value (i.e., 15.43 V) of the voltage signal is obtained at the ten second mark.

Instead of waiting the full ten seconds to measure a stabilized value of voltage signal 22, the first calculation process may be employed to predict a stabilized value of the voltage signal prior to the voltage signal stabilizing. That is, the first calculation process may be employed to predict a stabilized value of voltage signal 22 early on while the voltage signal is variating and has not yet become stabilized.

With reference to FIG. 2A, the controller performing the first calculation process for predicting or estimating a stabilized value of voltage signal 22 initiates the first calculation process by measuring values of voltage signal 22 in first and second time segments $[t_A, t_A+T_{LA}]$ and $[t_B, t_B+T_{LB}]$ during an initial time duration of the voltage signal. The voltage values obtained at time instants $t_A$ and $t_B$ are referred as $V_A$ and $V_B$. The time segment durations $T_{LA}$ and $T_{LB}$ can have different values. Pursuant to the first calculation process, the controller then computes the slopes of voltage signal 22 using the values of the voltage signal in the time segments $[t_A, t_A+T_{LA}]$ and $[t_B, t_B+T_{LB}]$ using an appropriate method (multiple-point regression, . . . ). The obtained slope values are referred as $S_A$ and $S_B$. Pursuant to the first calculation process, the controller predicts the final value VF of voltage signal 22 (i.e., the predicted or estimated stabilized value of the voltage signal) from the equation #1:

$$VF = \frac{(S_B/S_A)V_A - (V_B)}{(S_B/S_A) - (1)} \qquad \text{[Eqn. \#1]}$$

For example, with reference to FIG. 2A, $S_A$=(5.08−0.00)/(1.00−0.00)=5.08; $S_B$=(8.50−5.09)/(2.00−1.00)=3.41; $S_B/S_A$=0.67; and VF=((0.67*0.00)−5.09)/(0.67−1)=15.42.

In this case, the estimated value of 15.42 V is essentially identical to the value of 15.43 V measured at the ten second mark. With reference to FIG. 2A, a difference between using the first calculation process versus measuring voltage signal 22 for the full ten seconds is that the estimated value of 15.42 V is obtained at just after the two second mark, in this example. As such, a stabilized value of voltage signal 22 is obtained early on instead of waiting the full ten seconds. The diagnostic process including the operations of comparing the stabilized value of voltage signal 22 with a standard and carrying out appropriate control actions, per blocks 16 and 18 of FIG. 1, can thereby be conducted by the controller with reduced processing time. Further, as evident from the description, the required processing capability is low.

Figure 2B:
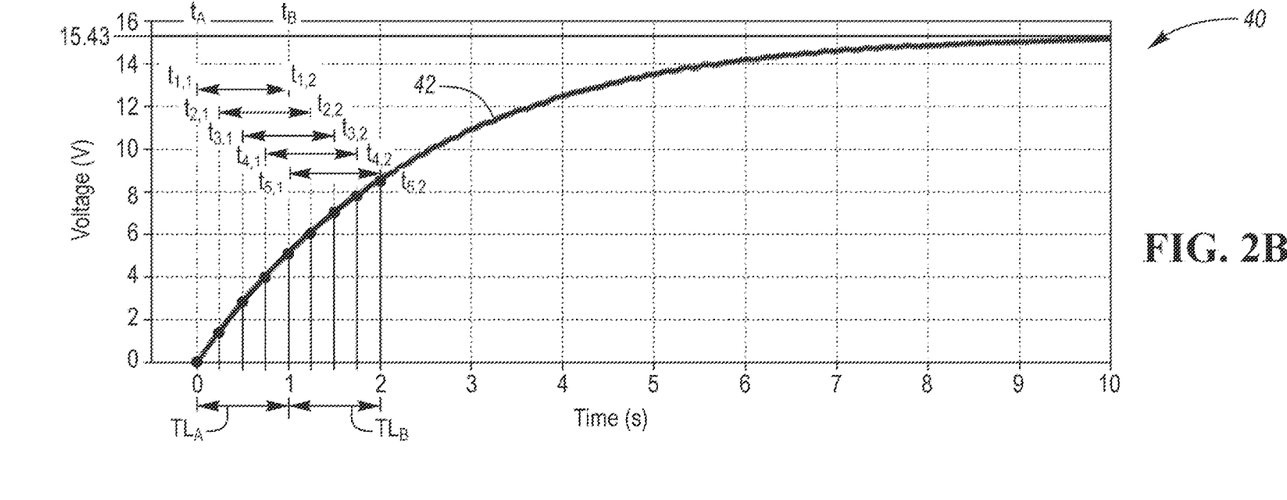
FIG. 2B illustrates a plot corresponding to a second calculation process for predicting a stabilized value of a voltage signal to be compared with a standard during a diagnostics process, the second calculation process being employed by methods and systems for performing the diagnostics process with reduced processing time.

Referring now to FIG. 2B, with continual reference to FIG. 1, a plot 40 corresponding to a second calculation process for predicting a stabilized value of a voltage signal 42 to be compared with a standard during a diagnostics process is shown. The second calculation process may be carried out by the above-noted electronic controller or the like. The second calculation process pertains to predicting a stabilized value of voltage signal 42 prior to the voltage signal stabilizing with the prediction being based on the variation of the voltage signal while the voltage signal is not stabilized. The second calculation process thus corresponds to block 14 of FIG. 1 and may be employed by methods and systems for performing the diagnostics process with reduced processing time.

Voltage signal 42 is a noisy version of voltage signal 22 shown in plot 20 of FIG. 2A. Noise can introduce error in the measurements of a voltage signal. To avoid this, the second calculation process measures multiple pair voltage points. Particularly, pursuant to the second calculation process, several pairs of points at time $t_{i,1}$ and $t_{i,2}$ with the condition that $t_{i,2}-t_{i,1}=t_B-t_A$ are measured, where measured voltage signal values at time points $t_i$ and $t_{i+1}$ are referred as $V_{i,1}$ and $V_{i,2}$. The second calculation process also captures data to perform the computation of two slopes $S_A$ and $S_B$ using an appropriate method (multiple-point regression, . . . ). At a time when both slopes $S_A$ and $S_B$ are already computed (usually $t=t_B+t_{LB}$) and using the information stored, the controller carrying out the second calculation process computes several $VF_i$ from the equation #2:

$$VF_i = \frac{(S_B/S_A)(V_{i,1}) - V_{i,2}}{(S_B/S_A) - (1)} \qquad \text{[Eqn. \#2]}$$

The controller carrying out the second calculation process then predicts the final value VF of voltage signal 42 (i.e., the predicted or estimated stabilized value of the voltage signal) from an average of these computed values using the equation #3:

$$VF = \frac{1}{N}\sum_{i=1}^{N} VF_i \qquad \text{[Eqn. \#3]}$$

For example, with reference to FIG. 2B, $S_A$=5.12 (obtained by multiple-point regression); $S_B$=3.40 (obtained by multiple-point regression); $S_B/S_A$=0.66; $V_{F1}$=(0.66*0.00−5.31)/(0.66−1)=15.79; $V_{F2}$=(0.66*1.61−6.29)/(0.66−1)

=15.53; $V_{F3}=(0.66*2.82-7.08)/(0.66-1)=15.48$; $V_{F4}=(0.66*4.10-7.88)/(0.66-1)=15.34$; and $V_{F5}=(0.66*5.31-8.68)/(0.66-1)=15.32$; and $VF=(15.79+15.53+15.48+15.34+15.32)/5=15.49$.

Again, in this example, at the two second mark the required measurements of voltage signal 42 have been done so the second calculation process can compute the slopes $S_A$ and $S_B$ and the voltage values $VF_i$ for i=1, 2, 3, 4, and 5. Therefore, the second calculation process can be used to predict, even with the noise, the stabilized value VF=15.49 V which is nearly identical to the voltage value 15.43 V measured at the ten second mark. As such, like the first calculation process, the calculation done at the two second mark obtains the stabilized value of voltage signal 42 at the ten second mark within a tolerance ε of less than 0.5%. Furthermore, as evident from the description, like the first calculation process, the required processing capability is low.

Figure 3:
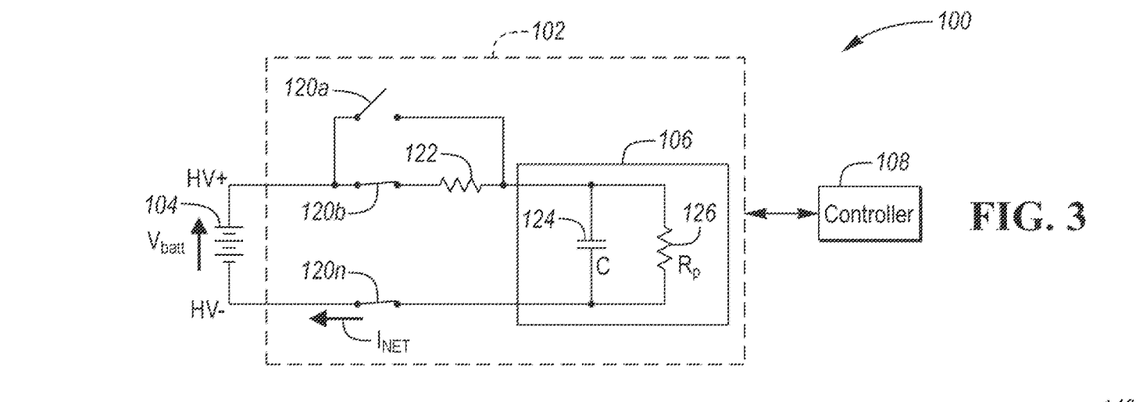
FIG. 3 illustrates a block diagram of a system of a vehicle having a high-voltage (HV) battery, a HV power-net, and a controller in which the controller is configured to perform short circuit and low impedance diagnostic processes with reduced processing time for a pre-charge operation involving the battery charging the HV power-net.

Referring now to FIG. 3, a block diagram of a system 100 of a vehicle 102 having a high-voltage (HV) battery 104, a HV power-net 106, and a controller 108 is shown. Controller 108 is electrically coupled to HV power-net 106. Controller 108 is configured to control a pre-charge operation involving battery 104 charging HV power-net 106. Controller 108 initiates the pre-charge operation when vehicle 102 is started. Controller 108 is further configured to perform a short circuit diagnosis and a low impedance diagnosis of HV power-net 106 with reduced processing time for the pre-charge operation.

Vehicle 102 further includes a plurality of switches 120a, 120b, and 120n and a pre-charger resistor 122. HV power-net 106 includes a capacitor 124 (C) and a load resistor 126 ($R_P$). HV power-net 106 represents a physical model of capacitance and resistance values within vehicle 112. During the pre-charge operation, switch 120a is opened and controller 108 controls switches 120b and 120n to close thereby enabling battery 104 to provide a voltage ($V_{batt}$) through pre-charge resistor 122 to HV power-net 106.

Controller 108 controls switches 120a, 120b, and 120n to be activated or deactivated to initialize and enter or exit the pre-charge operation. When vehicle 102 exits the pre-charge operation, the vehicle enters a normal operating mode where battery 104 supplies power to HV power-net 106 under normal driving conditions. Battery 104 is a HV battery which may be in the range of 150-450 V or other HV range. Given that battery 104 provides a relatively large amount of voltage to HV power-net 106, the pre-charge operation serves to minimize the amount of in-rush current provided to the HV power-net when the HV power-net is being powered up. Specifically, pre-charge resistor 122 slows down the amount of current flowing from battery 104 into HV power-net 106 during the pre-charge operation. Capacitor 124 slowly stores the voltage from battery 104 during the pre-charge operation. Once capacitor 124 is fully charged, controller 108 opens switch 120b and closes switch 120a to exit the pre-charge operation.

Load resistor 126 represents an impedance across HV power-net 106. During a short circuit diagnostics process, controller 108 detects a short circuit of HV power-net 106 when load resistor 126 has a resistance lower than a predetermined standard. This condition corresponds to capacitor 124 or other component in HV power-net 106 (e.g., secondary capacitance, electronic circuits, wiring, etc.) exhibiting a short circuit condition. During a low impedance diagnostics process, controller 108 detects a low impedance for HV power-net 106 when load resistor 126 has a resistance falling between (i) the predetermined standard used for the short circuit diagnosis and (ii) a second, greater predetermined standard. HV power-net 106 may exhibit a low impedance due to the ageing of components of the HV power-net.

Performing the short circuit and low impedance diagnostic processes with reduced processing time may be beneficial in that may be advantageous to detect any short circuit or low impedance condition rapidly during the pre-charge operation.

Figure 4:
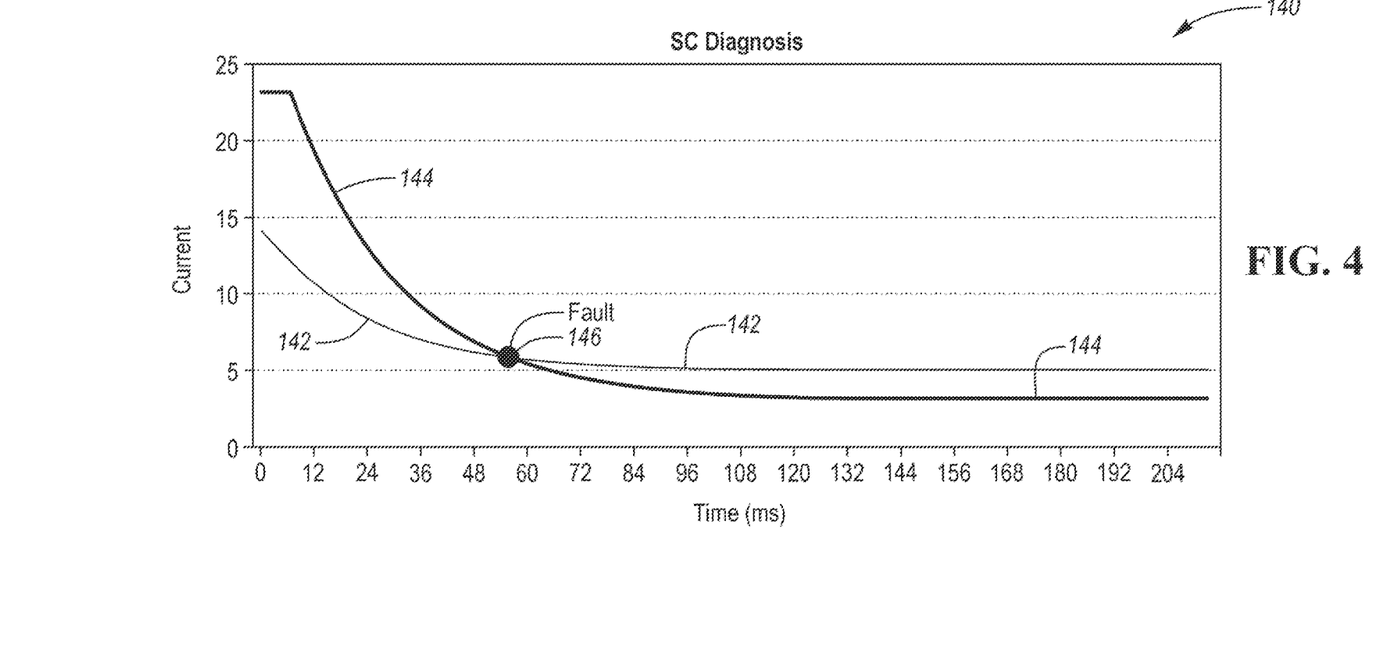
FIG. 4 illustrates a plot corresponding to a short circuit fault in the HV power-net during the pre-charge operation of the system of FIG. 3, the controller detecting the short circuit condition using operation for performing the short circuit diagnostics process with reduced processing time.

Referring now to FIG. 4, with continual reference to FIGS. 1, 2A, 2B, and 3, a plot 140 corresponding to a short circuit fault in HV power-net 106 during the pre-charge operation of system 100 is shown. Controller 108 detects the short circuit condition using operation for performing the short circuit diagnostics process with reduced processing time.

Plot 140 includes a plot of a current signal 142 (labeled "$I_{NET}$" in FIG. 3) supplied from battery 104 over time during the pre-charge operation of system 100. As an example, as indicated in plot 140, the duration of the pre-charge operation is about two hundred milliseconds. A current sensor (not shown) in communication with controller 108 measures current signal 142 as the current signal is generated. Current signal 142 is the physical parameter which is measured over time per block 12 of FIG. 1.

Plot 140 further includes a plot of a predetermined, short circuit threshold 144 over the same time. Short circuit threshold 144 is stored in the memory of controller 108. Short circuit threshold 144 is a standard to which current signal 142 is to be compared to determine whether a short circuit exists. Particularly, a stabilized value of current signal 142 at a given time is to be compared to a value of short circuit threshold at the given time per block 16 of FIG. 1. Controller 108 detects a short circuit depending on this comparison and may perform a control action depending on this comparison per block 18 of FIG. 1.

As shown in FIG. 4, the form of short circuit threshold 144 has an exponential shape and is generally continuous, initially variates and becomes stable as time increases, and approaches a limit value or value range as the time approaches an ending time of the pre-charge operation. As short circuit threshold 144 is predetermined, the form of the short circuit threshold is known. Assuming the pre-charge operation is normal, it is also known that current signal 142 will have a form like short circuit threshold 144. Accordingly, as also shown in FIG. 4, current signal 142 also has an exponential shape and is also generally continuous, initially variates and becomes stable as time increases, and approaches a limit value or value range as the time approaches the ending time.

Current signal 142 and short circuit threshold 144 thus both variate and are not stabilized during the beginning of the pre-charge operation and both become stabilized during the ending of the pre-charge operation. Current signal 142 and short circuit threshold 144 have stabilized values at corresponding times at the ending time of the pre-charge operation.

Accordingly, it can be determined whether current signal 142 becomes greater than short circuit threshold 144 during the pre-charge operation by comparing a stabilized value of current signal 142 at a given time to the value of short circuit threshold at the given time. If current signal 142 becomes greater than short circuit threshold 144, then a short circuit is present. If current signal 142 does not become greater than short circuit threshold 144, then a short circuit is not present.

Current signal 142 is thus to be compared with short circuit threshold 144 while the current signal is generated during the pre-charge operation. This comparison is done to determine whether current signal 142 becomes greater than short circuit threshold 144. In the case that current signal 142 does not become greater than short circuit threshold 144, the comparison process would take the entire duration of the pre-charge operation (i.e., per the example, two hundred milliseconds). Likewise, in the case that current signal 142 becomes greater than short circuit threshold 144 at a relatively late time during the pre-charge operation such as at a time of one hundred fifty milliseconds, then the comparison process would not be terminated until the relatively late time of one hundred fifty milliseconds.

Controller 108 conducts the short circuit diagnostics process with reduced processing time by comparing a predicted stable value of current signal 142 at a given time with the value of short circuit threshold 144 at the given time. Controller 108 predicts the stable value of current signal 142 using the first or second calculation process or other similar calculation process on the values of the current signal measured during the beginning of the pre-charge operation. As such, controller 108 predicts the stable value of current signal 142 based on the variation of the current signal while the current signal is not yet stabilized. In this way, controller 108 predicts a stable value of current signal 142, prior to stabilization of the current signal, based on a variation of the current signal while the current signal is not yet stabilized per block 14 of FIG. 1.

For example, as shown in FIG. 4, current signal 142 becomes greater than short circuit threshold 144 at fault point 146 occurring a time of about fifty-four milliseconds. As further shown in FIG. 4, current signal 142 and short circuit threshold 144 have stabilized values after the beginning of the pre-charge operation. Thus, instead of measuring current signal 142 and comparing same to short circuit threshold 144 until the current signal becomes greater than short circuit threshold 144 (which in this example occurs relatively early at fifty-four milliseconds, but could have occurred much later or not at all), controller 108 predicts, during the beginning of the pre-charge operation, a stable value of current signal 142 which the current signal will have during the ending of the pre-charge operation. As explained, controller 108 predicts this stable value of current signal 142 based on the variation of the current signal during the beginning of the pre-charge operation. Controller 108 then compares this stable value of current signal 142 with a corresponding value of short circuit threshold 144 to determine whether a short circuit condition exists, pursuant to block 16 of FIG. 1. As controller 108 performs these prediction and comparison steps early on during the beginning of the pre-charge operation, the controller conducts the short circuit diagnostics process with reduced processing time.

Controller 108 is further configured to perform control actions depending on whether a short circuit condition exists, pursuant to block 18 of FIG. 1. Particularly, upon controller 108 detecting a short circuit condition, the controller terminates the pre-charge operation and controls switches 120 to prevent battery 104 from being connected to HV network 106. Further, controller 108 may cause vehicle 102 to be immobilized and the vehicle driver to be informed of the fault condition.

Controller 108 also performs a low impedance diagnostics process with reduced processing time for HV power-net 106 during the pre-charge operation of system 100. As indicated, a low impedance condition for HV power-net 106 exists when load resistor 126 has a resistance falling between (i) a predetermined standard used for the short circuit diagnosis and (ii) a second, greater predetermined standard. That is, a low impedance condition exists when a current signal does not become greater than a short circuit threshold during the pre-charge operation but the current signal is greater than a predetermined, low impedance threshold at an ending time of the pre-charge operation. Thus, a low impedance condition may be present in the event of a short circuit condition being absent.

A problem is that a measured value of the current signal at an ending time cannot be obtained until the current signal is measured at the ending time. As the pre-charge operation may last, for example, on the order of two hundred milliseconds, the measured value of the current signal cannot be obtained until two hundred milliseconds has elapsed.

Controller 108 thus conducts the low impedance diagnostics process with reduced processing time by comparing a predicted stable value of the current signal at the ending time with the low impedance threshold at the ending time. Controller 108 predicts the stable value of the current signal using the first or second calculation process or other similar calculation process on the values of the current signal measured during the beginning of the pre-charge operation. Thus, instead of waiting for the ending time and measuring the current signal to compare same with the low impedance threshold, controller 108 predicts, during the beginning of the pre-charge operation, a stable value of the current signal which the current signal will have at the ending time. Controller 108 then compares this stable value of the current signal with a corresponding value of the low impedance threshold to determine whether a low impedance condition exists, pursuant to block 16 of FIG. 1. As controller 108 performs these prediction and comparison steps during the beginning of the pre-charge operation, the controller conducts the low impedance diagnostics process with reduced processing time.

Controller 108 is further configured to perform control actions depending on whether a low impedance condition exists, pursuant to block 18 of FIG. 1. Particularly, upon controller 108 detecting a low impedance condition, the controller may terminate the pre-charge operation and may control switches 120 to prevent battery 104 from being connected to HV network 106. Alternatively, upon controller 108 detecting a low impedance condition, controller 108 may cause other diagnostic tests to be performed to try to identify any consuming loads which are not properly disconnected. Such improperly disconnected loads could cause the low impedance condition. Upon such improperly disconnected loads being identified, controller 108 may cause such loads to be properly disconnected. Alternatively, upon controller 108 detecting a low impedance condition, the controller may cause the vehicle driver to be informed of the low impedance condition, but still continue with the pre-charge operation depending on the severity of the low impedance condition.

Figure 5:
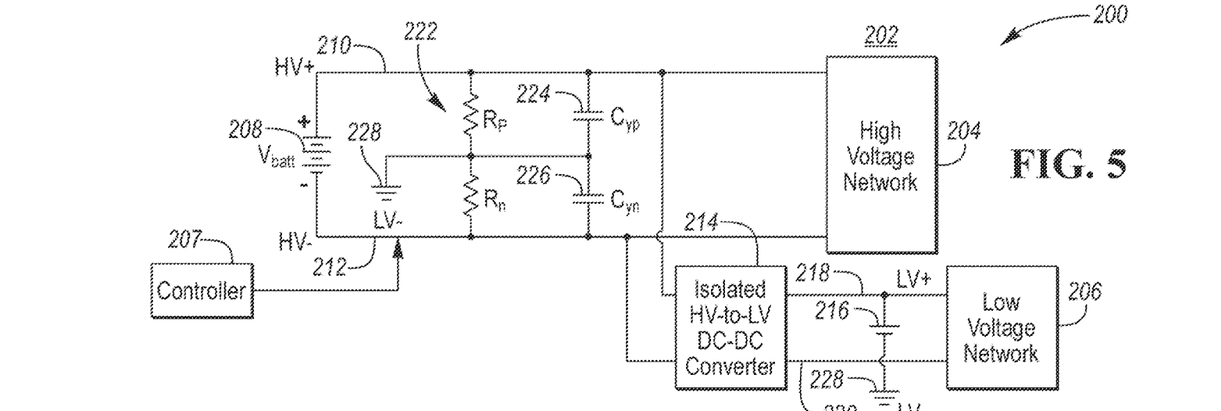
FIG. 5 illustrates a block diagram of a system including a model of an insulation resistance between a HV power-net and a low-voltage (LV) power-net of a vehicle, the system having a controller configured to perform an insulation resistance monitoring diagnostics process of the insulation resistance with reduced processing time.

Referring now to FIG. 5, a block diagram of a system 200 of a vehicle 202 including a model of an insulation resistance between a HV power-net 204 and a low-voltage (LV) power-net 206 of the vehicle is shown. System 200 further includes a controller 207 configured to perform an insulation resistance monitoring diagnostics process, for measuring insulation resistance between HV power-net 204 and LV power-net 206, with reduced processing time.

Vehicle 202 includes a battery 208 connected to a HV positive branch 210 (HV+) and a HV negative branch 212 (HV−). HV power-net 202 (e.g., battery charging system) is arranged to receive high voltage (e.g., over 200V) from battery 208 via HV positive and negative branches 210 and 212. A DC/DC converter 214 converts the high voltage from battery 208 into a low voltage (e.g., 12-16V) suitable for consumption by LV power-net 206 and for storage on at least one LV battery 216. Devices on LV power-net 206 may include heating/cooling devices, power windows, entertainment systems, vehicle lighting, vehicle locking/unlocking device, etc. DC/DC converter 214 provides the low voltage to LV power-net 206 via a LV positive branch (LV+) 218 and a LV negative branch (LV−) 220.

Controller 207 is configured to monitor an insulation resistance 222 (Rp and Rn) in vehicle 202. First and second decoupling capacitors 224 (Cp) and 226 (Cn) are placed in parallel with the internal resistances Rp and Rn, respectively. Insulation resistance 222 does not comprise actual resistors implemented within vehicle 202 for providing the high and low voltages to the HV and LV power-nets. Rather, insulation resistance 222 represents a model of the resistance formed between the HV and LV power-nets. Such an insulation resistance 222 should sustain an adequate level of resistance to prevent excessive current flow from HV power-net 204 to LV power-net 206. For example, HV power-net 204 is grounded at the negative terminal of battery 208 while LV power-net 206 is grounded at a vehicle chassis ground 228. In the event HV power-net 204 and/or LV power-net 206 is not properly grounded, an insulation fault may occur thereby creating a low-resistance path between the HV and LV power-nets.

Controller 207 monitors insulation resistance 222 periodically while vehicle 202 is in operation. Controller 207 controls switches of an insulation resistance monitoring circuit (not shown) provided in arrangement with HV and LV power-nets 204 and 206 to perform the insulation resistance monitoring diagnostics process. The control of the switches per switch cycles causes a voltage signal to be generated between HV and LV power-nets 204 and 206 during each switch cycle. The voltage signal is the voltage measurements from Rp//Cyp and from Rn//Cyn at respective switch cycles. Controller 207 analyzes the voltage signal to measure insulation resistance 222. If insulation resistance 222 is lower than a predetermined standard, then the insulation resistance may be inadequate and controller 207 will thereby detect an insulation resistance fault.

A problem is that a stabilized value of the voltage signal is to be analyzed for measuring insulation resistance but the voltage signal does not become stabilized for some time. As explained in greater detail below, controller 207 circumvents this problem by performing an insulation resistance monitoring diagnostics process of insulation resistance 222 with reduced processing time. Performing the insulation resistance monitoring diagnostics process with reduced processing time may be beneficial in that it may be advantageous to detect any defect in the insulation resistance rapidly.

Figure 6:
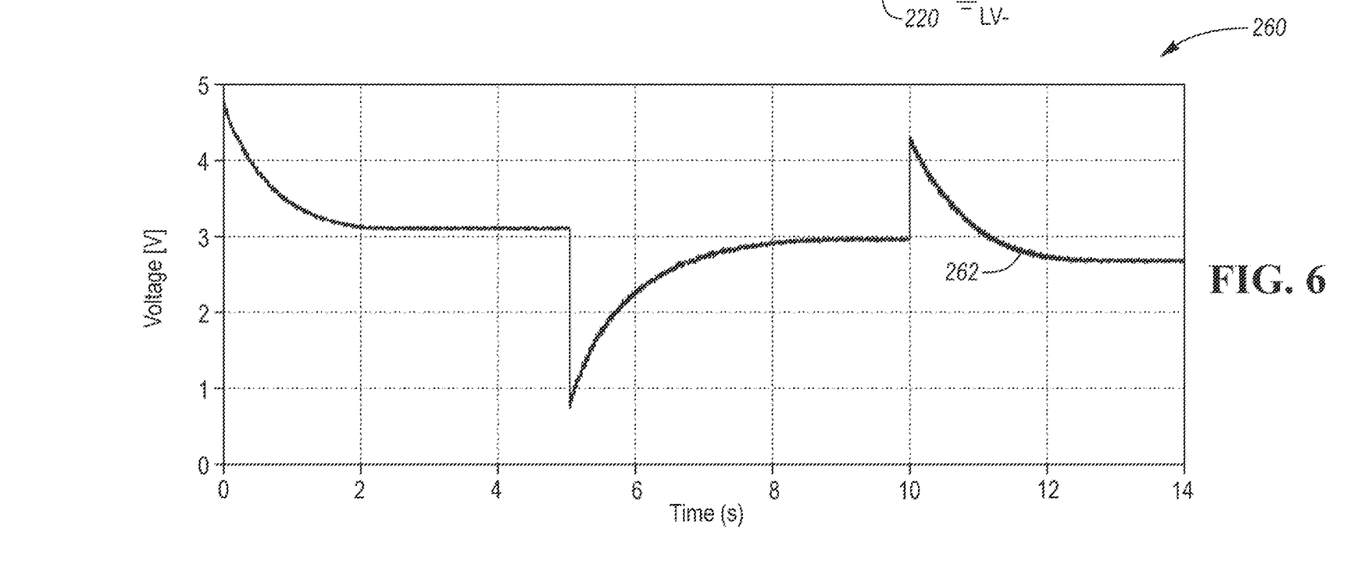
FIG. 6 illustrates a plot corresponding to a voltage signal generated between the HV and LV power-nets of the system of FIG. 5 during the insulation resistance monitoring diagnostics process, the controller is to analyze a stabilized value of the voltage signal for the insulation resistance monitoring diagnostics process.

Referring now to FIG. 6, with continual reference to FIG. 5, a plot 260 corresponding to a voltage signal 262 generated between HV and LV power-nets 204 and 206 of system 200 during the insulation resistance monitoring diagnostics process is shown. Controller 207 detects a value of the insulation resistance based on a stabilized value of voltage signal 262. As such, a stabilized value of voltage signal 262 is to be analyzed to detect a value of the insulation resistance.

A voltage sensor (not shown) in communication with controller 207 measures voltage signal 262 as the voltage signal is generated. Voltage signal 262 is the physical parameter which is measured over time per block 12 of FIG. 1.

As shown in FIG. 6, during a switch cycle ("cycle") (three cycles are shown in plot 206), the form of voltage signal 262 is exponential and is generally continuous, initially variates during the beginning of the cycle and becomes stable as time increases, and approaches a limit value or value range after the beginning of the cycle. Assuming voltage signal 262 is generated under normal conditions during the insulation resistance monitoring diagnostics process, it is known that voltage signal 262 will have the illustrated form. Voltage signal 262 thus variates and is not stabilized during the beginning of a cycle and becomes stabilized during the ending of the cycle. Voltage signal 262 has a stabilized value during the ending of the cycle.

Controller 207 conducts the insulation resistance monitoring with reduced processing time by determining a value of the insulation resistance based on a predicted stable value of voltage signal 262. Controller 207 predicts the stable value of voltage signal 262 using the first or second calculation process or other similar calculation process on the values of the voltage signal measured during the beginning of the cycle. As such, controller 207 predicts the stable value of voltage signal 262 based on the variation of the voltage signal while the voltage signal is not yet stabilized. In this way, controller 207 predicts a stable value of voltage signal 262, prior to stabilization of the voltage signal, based on a variation of the voltage signal while the voltage signal is not yet stabilized per block 14 of FIG. 1.

For example, as shown in FIG. 6, voltage signal 262 becomes stabilized and has a stabilized value after about two seconds into a cycle. As further shown in FIG. 6, the cycle lasts about four and a half seconds. Thus, instead of measuring voltage signal 262 at some point during the end of the cycle and then detecting the value of the insultation resistance based on this measured value, controller 207 predicts, during the beginning of the cycle, a stable value of the voltage signal which the voltage signal will have during the end of the cycle and then detects the value of the insulation resistance based on this predicted stable value. As explained, controller 207 predicts this stable value of voltage signal 262 based on the variation of the voltage signal during the beginning of the cycle. As controller 207 performs these predicting and determining steps early on during the beginning of the cycle, the controller conducts the insulation resistance monitoring diagnostics process with reduced processing time. For example, as controller 207 can detect a value of the insulation resistance in less time (i.e., after about two seconds into a four and a half second cycle), the controller can speed up the switching of the switches of the insulation resistance monitoring circuit from the four and a half second period to a two second period.

Controller 207 is further configured to perform control actions depending on the detected value of the insulation resistance. Again, controller 207 detects the value of the insulation resistance periodically at vehicle start and during operation of the vehicle. Upon controller 207 detecting lowest values of the insulation resistance (i.e., the worst case involving symmetric low impedance), the controller may cause the vehicle to be immobilized, the HV battery to be disconnected, and/or servicing to be requested. Upon controller 207 detecting low values of the insulation resistance (i.e., asymmetric low impedance involving only one of Rp or Rn being low), the controller may cause a notification to be provided for the vehicle user while allowing the vehicle to continue to operate.

As described, methods and systems for performing diagnostic processes with reduced processing time in accordance with the present invention involve predicting a stabilized value of a physical parameter during a beginning time prior to the physical parameter stabilizing during an ending time. In some cases, the stabilized value may be predicted well ahead of the final time (for example, the stabilized value is predicted at two seconds ahead of the ten second final time per the description of plots 20 and 40 of FIGS. 2A and 2B, respectively). In these cases, the operation could further include predicting a value of the physical parameter at an intermediate time (e.g., at five seconds) to verify the exponential estimation with another real measurement of the physical parameter. This would thus further improve the estimation, while still being fast enough to provide reduced processing time. In this case, too, those cases where an anomalous behavior is found (e.g., faulty measuring system, high noise speeds, etc.) could be detected. This could lead to a rise to a faulty warning system.

As described, methods and systems for performing diagnostic processes with reduced processing time in accordance with the present invention are based on the physical parameter signals being exponential, such as illustrated in FIGS. 2A, 2B, 4, and 6. The exponential form is a common form for physical parameter signals generated for vehicle diagnostics to have and by selecting the time intervals pursuant to the first, second, or other calculation processes, there is the benefit of being able to reach a result with simple equations (i.e., simple and fast to use), such as equations #1, #2, and #3 identified above.

As described, controllers, such as vehicle controllers 108 and 207, of methods and systems for performing diagnostic processes with reduced processing time in accordance with the present invention may be electronic units embedded with software. Such controllers may have microcontrollers with limited processing capabilities, where a time-saving and a computing-load saving provided by the operation to perform diagnostic processes with reduced processing time is much appreciated.

While exemplary embodiments are described above, it is not intended that these embodiments describe all possible forms of the present invention. Rather, the words used in the specification are words of description rather than limitation, and it is understood that various changes may be made without departing from the spirit and scope of the invention. Additionally, the features of various implementing embodiments may be combined to form further embodiments of the present invention.

What is claimed is:

1. A system for a vehicle having a battery and a power-net, the system comprising:
   a controller configured to control a pre-charge operation involving the battery charging the power-net and to perform a short circuit diagnostic process with reduced processing time for the pre-charge operation;
   a sensor configured to measure an electrical parameter generated during the pre-charge operation, wherein the short circuit diagnostic process requires a stable value of the electrical parameter, wherein the electrical parameter variates while being generated during a beginning of the pre-charge operation and is stable while being generated during an ending of the pre-charge operation;
   the controller being in communication with the sensor and having a memory storing a predetermined, short circuit threshold;
   the controller further configured to perform the short circuit diagnostic process by (i) predicting, while the electrical parameter is being generated during the beginning of the pre-charge operation, a stable value of the electrical parameter which the electrical parameter will have at a given time during the ending of the pre-charge operation, the controller predicting the stable value of the electrical parameter based on variation of measured values of the electrical parameter during the beginning of the pre-charge operation, and by (ii) comparing, prior to the given time, the predicted stable value of the electrical parameter with a value that the short circuit threshold has at the given time to determine whether a short circuit exists;
   wherein the controller detects that a short circuit exists from the comparison of the predicted stable value of the electrical parameter with the value that the short circuit threshold has at the given time; and
   the controller performs a control action upon detecting the short circuit, wherein the control action performed by the controller upon detecting the short circuit is either the controller terminating the pre-charge operation, the controller causing the power-net to be disconnected from the battery, or the controller causing the vehicle to be immobilized.

2. The system of claim 1 wherein:
   the electrical parameter is a current signal.

3. The system of claim 1 wherein:
   the controller is further configured to obtain, from the sensor, measured values of the electrical parameter at a first pair of time instants of a first time segment during the beginning of the pre-charge operation and measured values of the electrical parameter at a second pair of time instants of a succeeding second time segment during the beginning of the pre-charge operation; and
   wherein the controller predicts the stable value of the electrical parameter based on (i) a first slope for the first time segment dependent on the measured values of the electrical parameter at the first pair of time instants and (ii) a second slope for the second time segment dependent on the measured values of the electrical parameter at the second pair of time instants.

4. The system of claim 1 wherein:
   the controller is further configured to obtain, from the sensor, measured values of the electrical parameter at three or more time instants of a first time segment during the beginning of the pre-charge operation and measured values of the electrical parameter at three or more time instants of a succeeding second time segment during the beginning of the pre-charge operation; and
   wherein the controller is further configured to predict the stable value of the electrical parameter based on (i) a first slope for the first time segment dependent on the measured values of the electrical parameter at the three or more time instants and (ii) a second slope for the second time segment dependent on the measured values of the electrical parameter at the three or more time instants.

5. The system of claim 1 wherein:
   the memory of the controller storing a predetermined, low impedance threshold;
   the controller is further configured to perform a low impedance diagnostics process with reduced processing time for the power-net during the pre-charge operation by comparing, while the electrical parameter is being generated during the beginning of the pre-charge operation, the stable value of the electrical parameter which the electrical parameter will have at the given time during the ending of the pre-charge operation with a value of the low impedance threshold at the given time to determine whether a low impedance exists; and the controller further configured to perform a control action depending on whether a low impedance is detected.

6. The system of claim 5 wherein:

the controller is further configured to cause other diagnostic tests to be performed to try to identify any consuming loads which are not properly disconnected upon a low impedance being detected.

7. The system of claim 1 wherein:

the memory of the controller storing a predetermined, low impedance threshold;

the controller is further configured to perform a low impedance diagnostics process with reduced processing time for the power-net during the pre-charge operation, wherein the low impedance diagnostics process requires a stable value of the electrical parameter;

the controller is further configured to perform the low impedance diagnostics process by (i) predicting, while the electrical parameter is being generated during the beginning of the pre-charge operation, a stable value of the electrical parameter which the electrical parameter will have at an end of the pre-charge operation, the controller predicting the stable value of the electrical parameter which the electrical parameter will have at the end of the pre-charge operation based on variation of measured values of the electrical parameter during the beginning of the pre-charge operation, and by (ii) comparing the predicted stable value of the electrical parameter which the electrical parameter will have at an end of the pre-charge operation with a value of the low impedance threshold at the end of the pre-charge operation to determine whether a low impedance exists; and the controller further configured to perform a control action depending on whether a low impedance is detected.

* * * * *